United States Patent
Hong et al.

(10) Patent No.: US 8,247,753 B2
(45) Date of Patent: Aug. 21, 2012

(54) SOLAR TRACKING DEVICE AND METHOD FOR HIGH-EFFECTIVE CONCENTRATION PHOTOVOLTAIC

(75) Inventors: Seokhoon Hong, Suncheon-si (KR); Mun-sig Kang, Suncheon-si (KR); Byung-Seok Jang, Suncheon-si (KR)

(73) Assignee: Paru Co., Ltd., Jeollanam-do (KR)

( * ) Notice: Subject to any disclaimer, the term of this patent is extended or adjusted under 35 U.S.C. 154(b) by 462 days.

(21) Appl. No.: 12/556,038

(22) Filed: Sep. 9, 2009

(65) Prior Publication Data

US 2010/0059043 A1   Mar. 11, 2010

(30) Foreign Application Priority Data

Sep. 10, 2008   (KR) .................... 10-2008-0089036

(51) Int. Cl.
*G01C 21/02* (2006.01)
*G01C 21/24* (2006.01)
*G01J 1/20* (2006.01)

(52) U.S. Cl. ............. 250/203.4; 250/206.1; 356/139.01; 136/246; 126/573

(58) Field of Classification Search ............... 250/203.4, 250/206.1; 356/139.01, 139.02; 136/246; 126/573–578
See application file for complete search history.

(56) References Cited

U.S. PATENT DOCUMENTS

| | | | | |
|---|---|---|---|---|
| 4,041,307 A | * | 8/1977 | Napoli et al. | 250/203.4 |
| 4,225,781 A | * | 9/1980 | Hammons | 250/203.4 |
| 4,367,403 A | * | 1/1983 | Miller | 250/203.4 |

FOREIGN PATENT DOCUMENTS

KR   100727283 B1   5/2007

\* cited by examiner

*Primary Examiner* — Francis M Legasse, Jr.
(74) *Attorney, Agent, or Firm* — The Webb Law Firm

(57) ABSTRACT

Provided is a high-effective concentration photovoltaic solar tracking device and method; and, more particularly, to a concentration photovoltaic solar tracking device and method, which maximize concentration efficiency by concentrating solar light using a Fresnel lens and moving a solar panel based on focus information formed when the concentrated solar light is irradiated on a photodiode.

9 Claims, 9 Drawing Sheets

[Fig. 1]
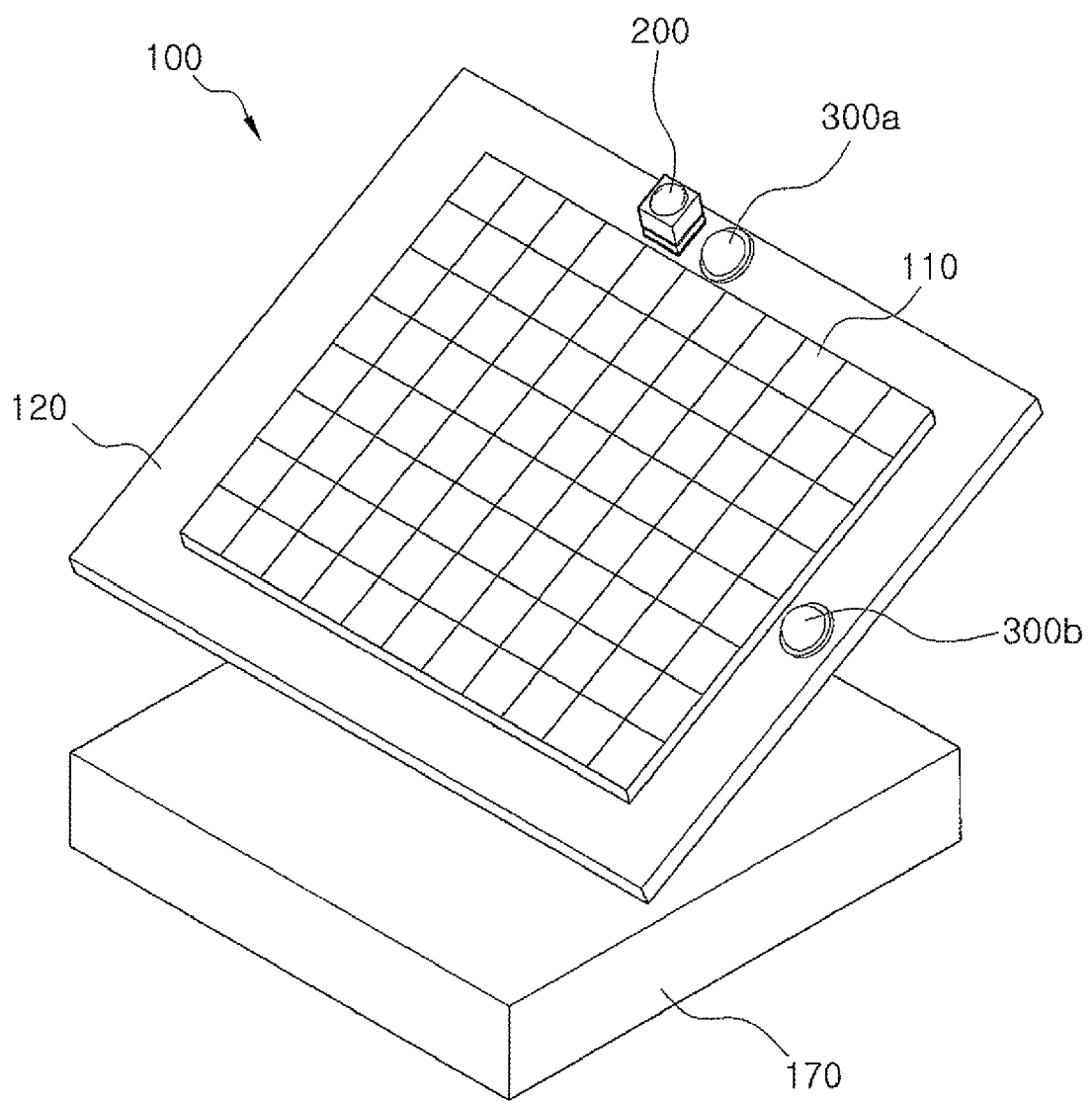

[Fig. 2A]
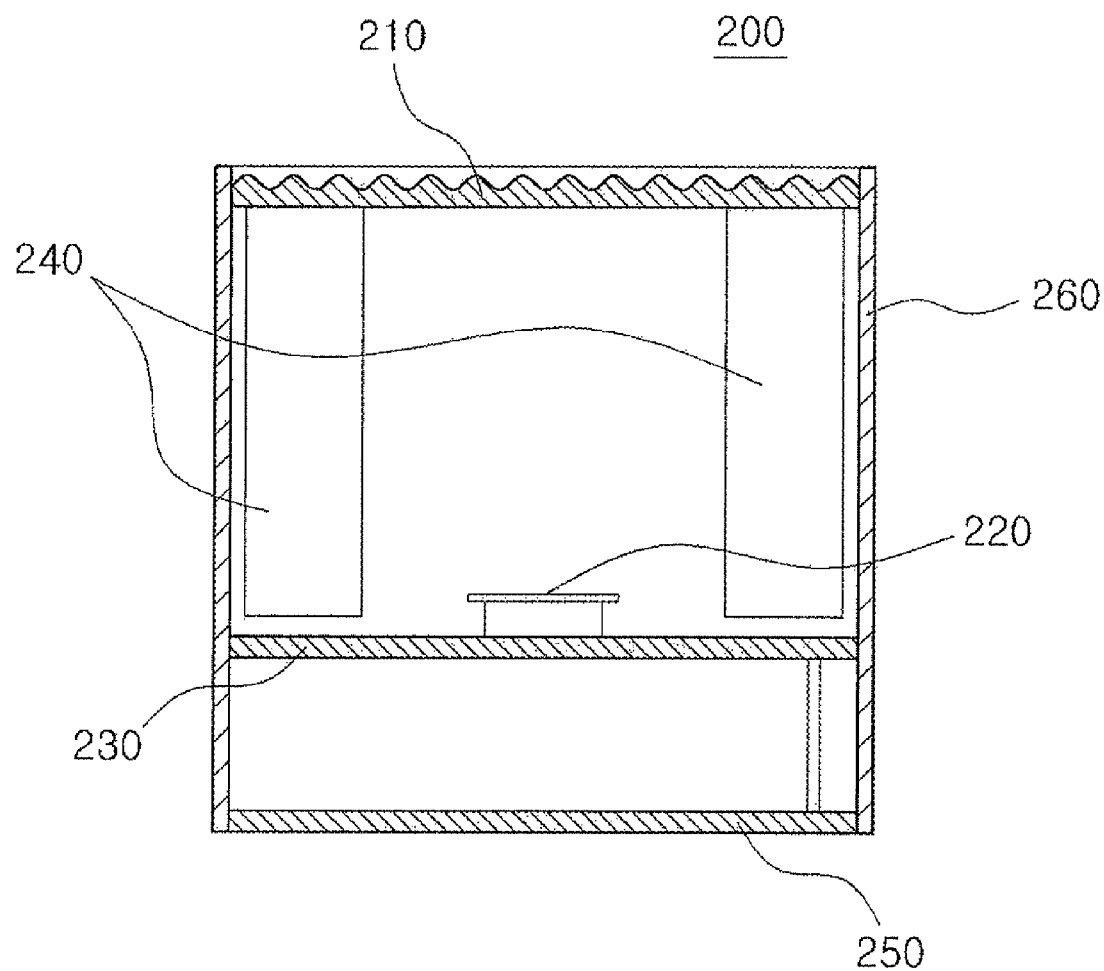

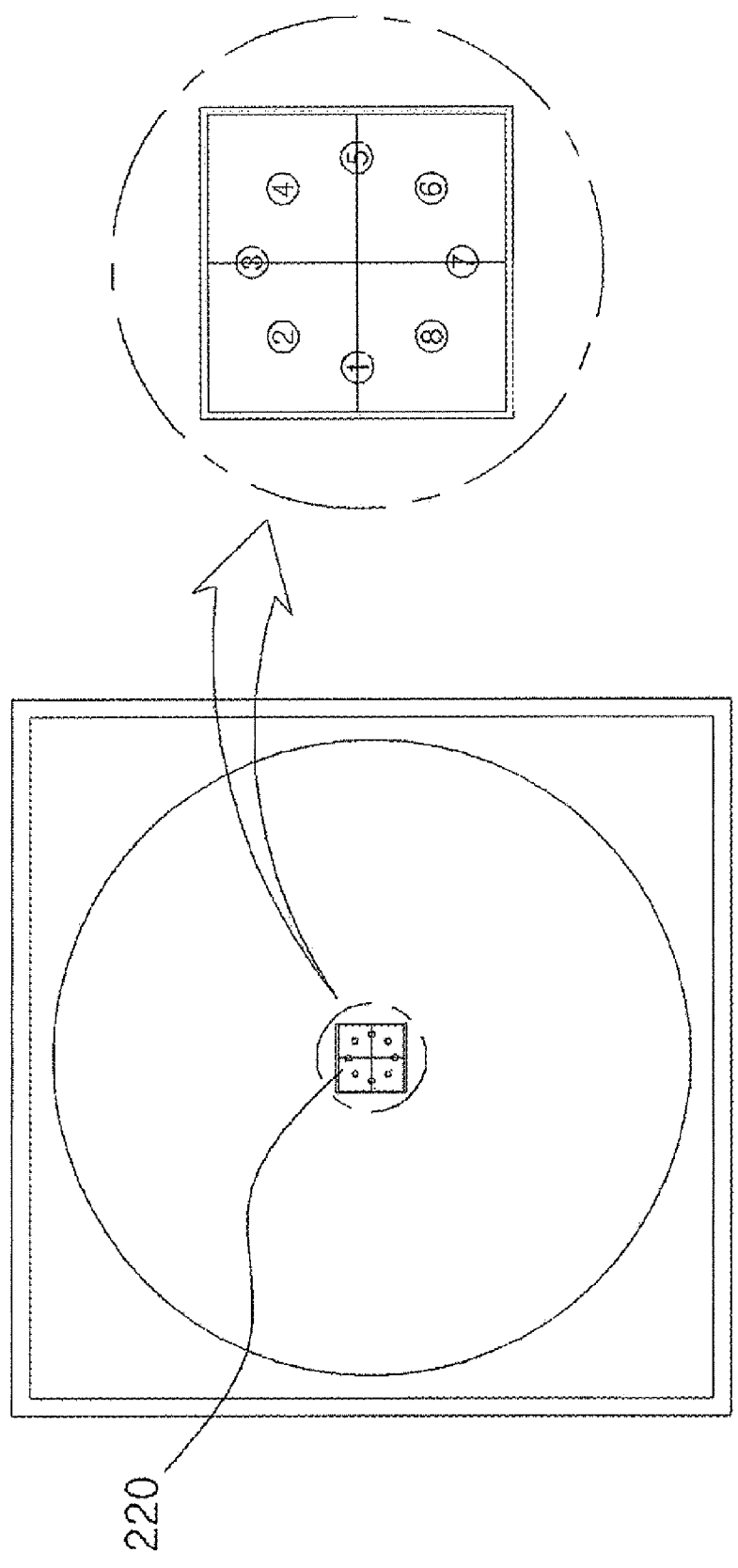

[Fig. 3A]
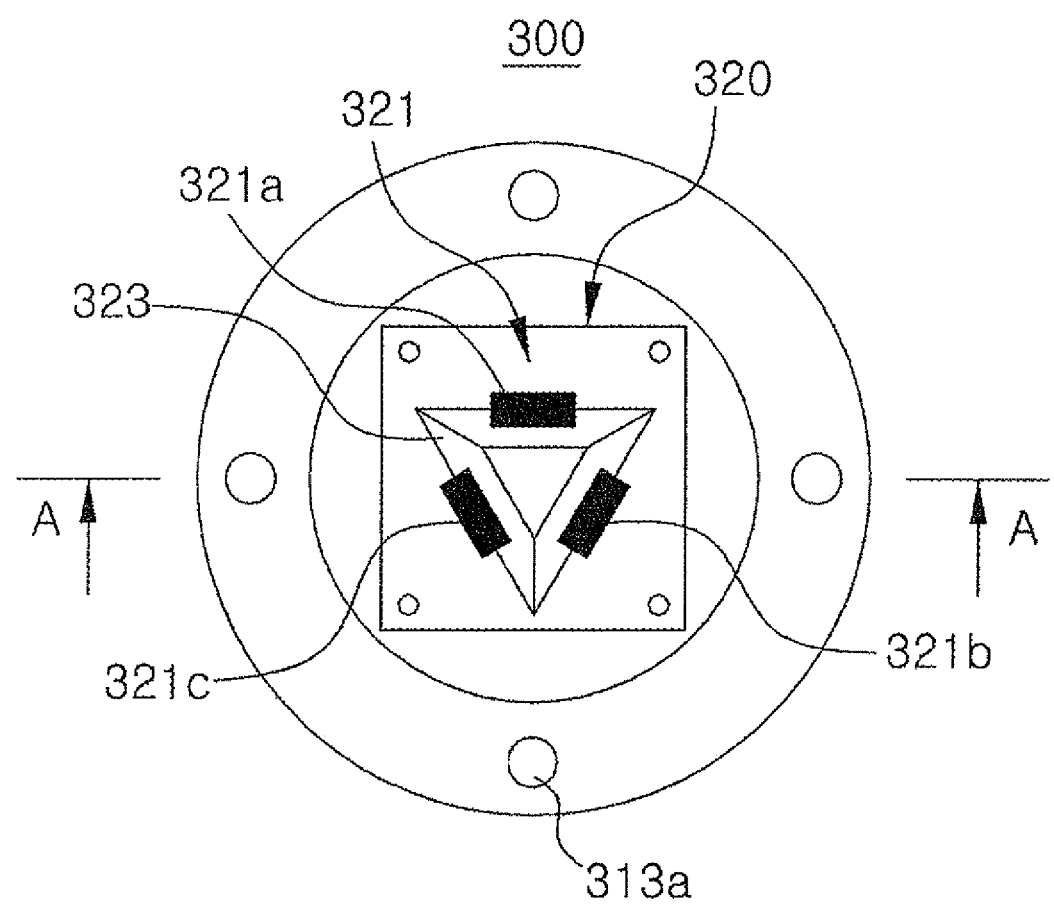

[Fig. 3B]
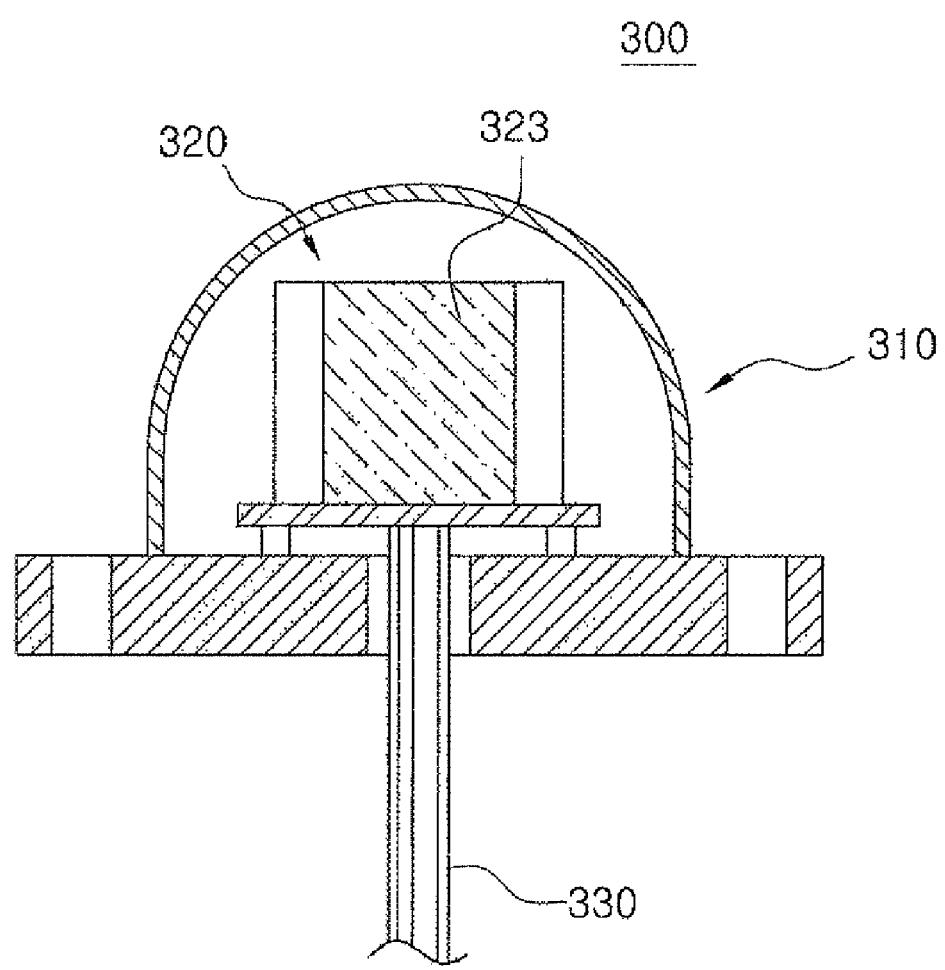

[Fig. 4]
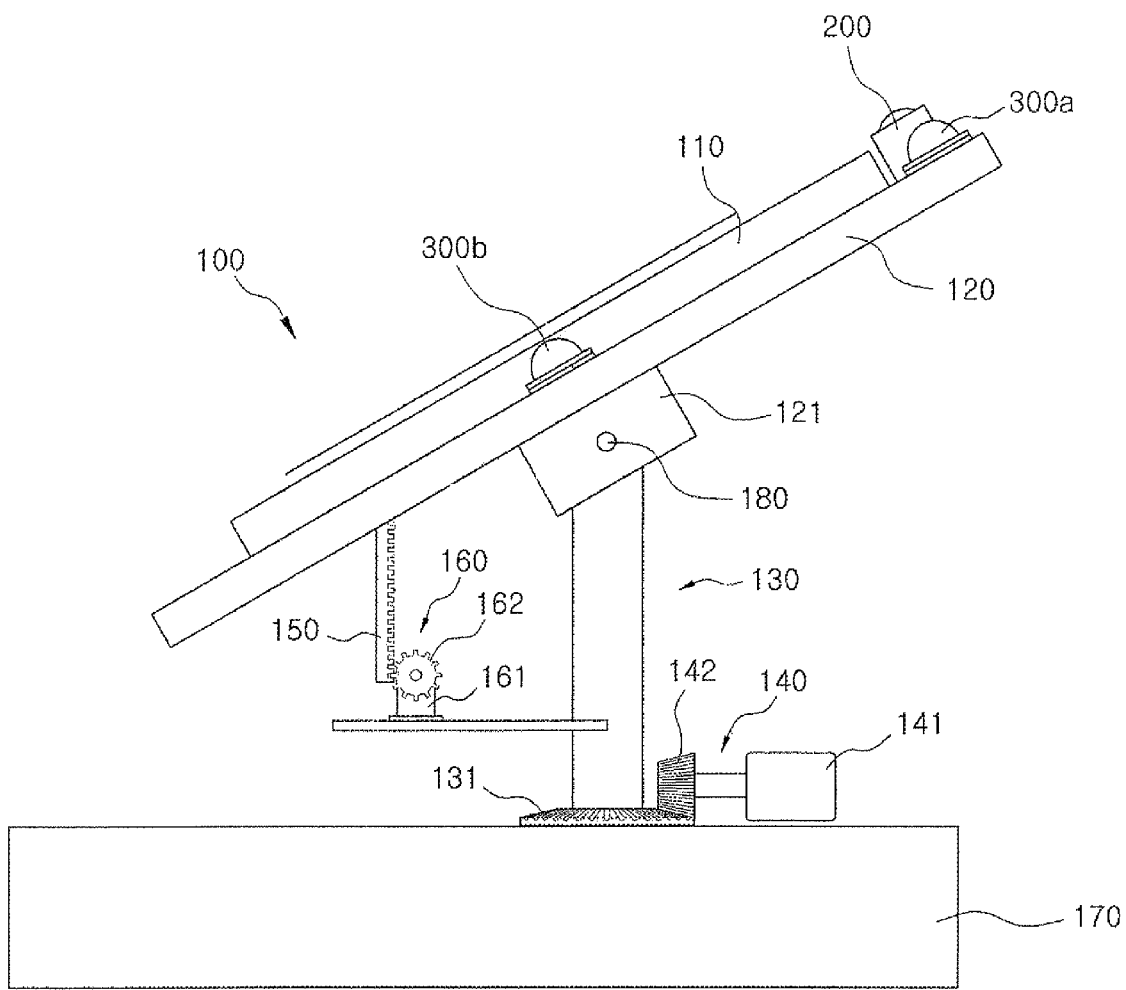

[Fig. 5]
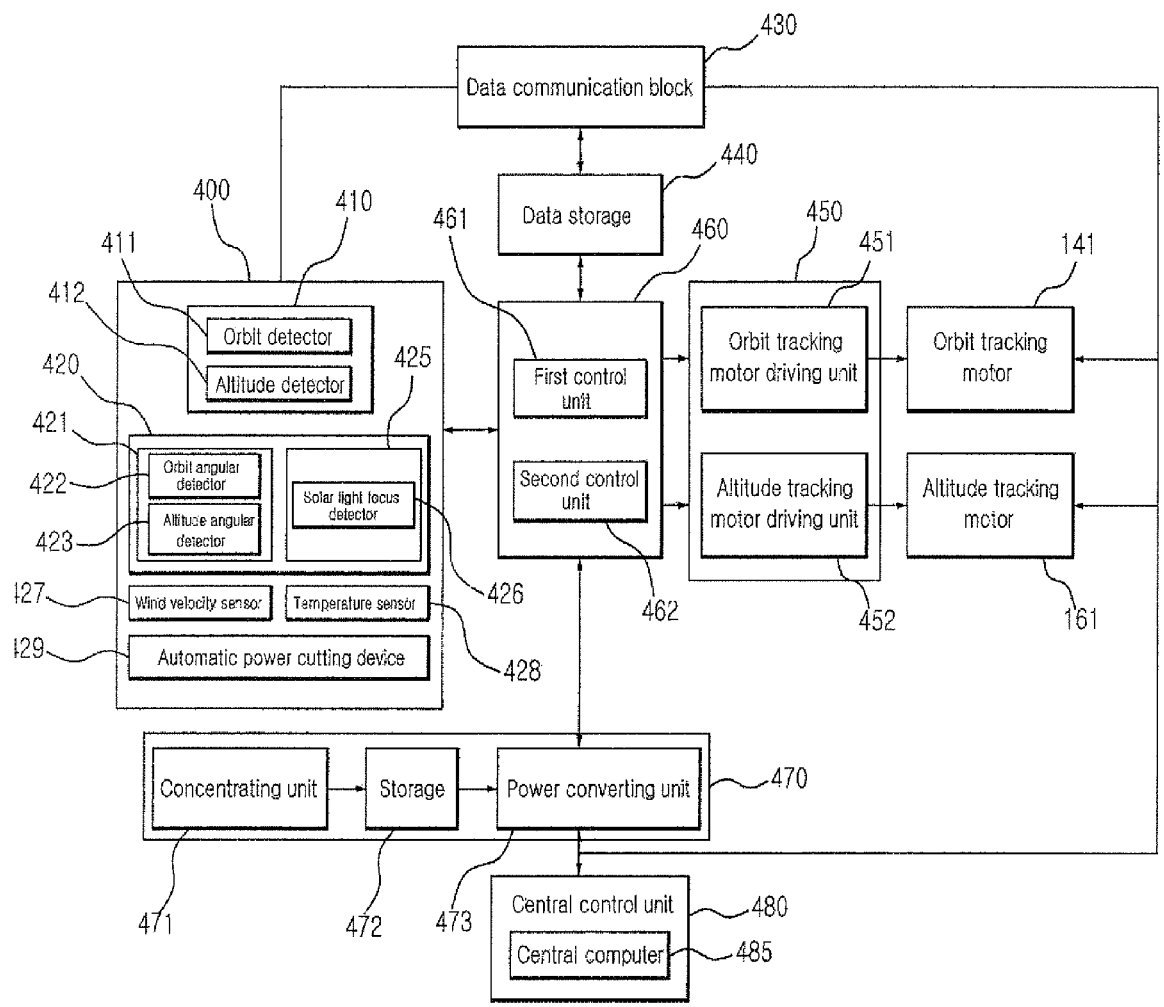

[Fig. 6]
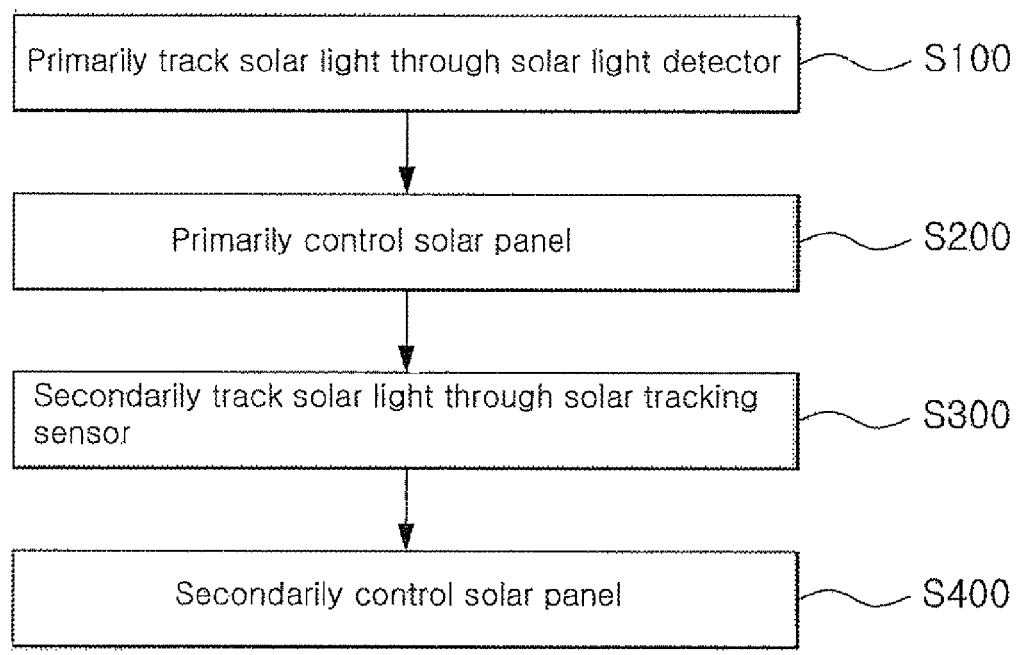

[Fig. 7]
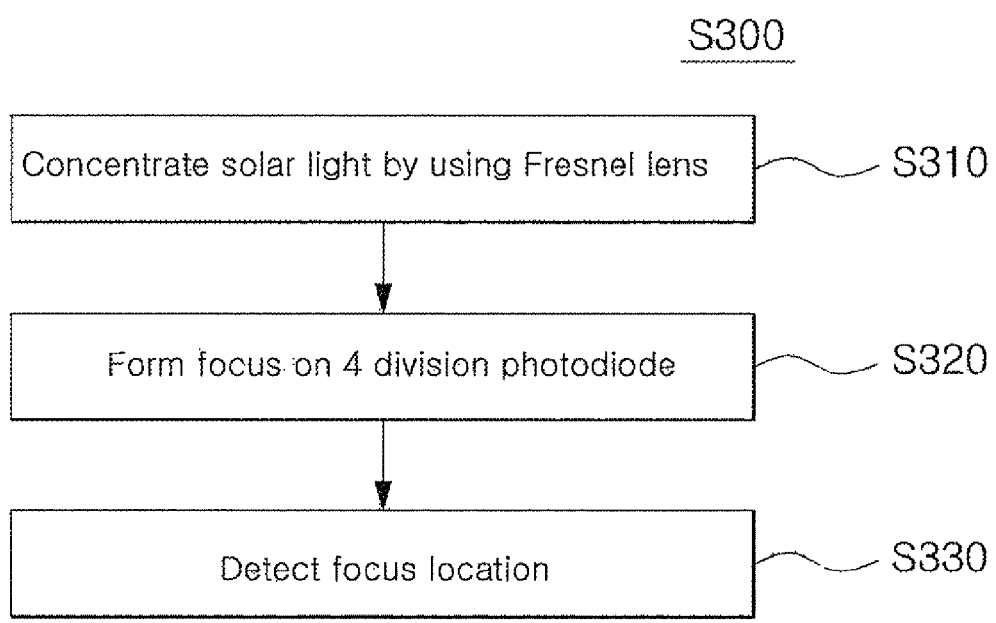

SOLAR TRACKING DEVICE AND METHOD FOR HIGH-EFFECTIVE CONCENTRATION PHOTOVOLTAIC

CROSS-REFERENCE(S) TO RELATED APPLICATIONS

The present invention claims priority of Korean Patent Application No. 10-2008-0089036, filed on Sep. 10, 2008, which is incorporated herein by reference.

BACKGROUND OF THE INVENTION

1. Field of the Invention

The present invention relates to a high-effective concentration photovoltaic solar tracking device and method; and, more particularly, to a concentration photovoltaic solar tracking device and method, which maximize concentration efficiency by concentrating solar light using a Fresnel lens and moving a solar panel based on focus information formed when the concentrated solar light is irradiated on a photodiode.

2. Description of Related Art

Generally, generating solar light is technology for transforming solar light into electric energy. The technology adopts a generation method using a solar cell for photovoltaic generation by photoelectric effect when light is irradiated. Its system generally includes a module having a solar cell, a storage battery and a power converting device. Also, the solar cell includes a selenium photocell using contact between a metal and a semiconductor, a copper sulfite photocell, and a silicon photocell using semiconductor p-n junction.

Meanwhile, there are benefits that the solar light generation is independent electric power generation of a clear and unlimited energy source and it is easy to maintain the system without a human power. However, although it is not considered that production efficiency is low in comparison with a generation method using fossil fuel such as coal and oil, there is a large deviation in electric power production according to solar irradiance.

Accordingly, as one method for solving the above problem, not an immobile solar cell, but a portable solar light generation device, which moves a solar panel according to variation of a solar orbit in order to maximize concentration efficiency, is introduced.

SUMMARY OF THE INVENTION

An embodiment of the present invention is directed to providing a concentration photovoltaic solar tracking device, which tracks the sun by performing fine control on an orbit and an altitude of a solar panel using a Fresnel lens and a 4 division photodiode in a state that a solar panel is controlled correspondingly to solar light by detecting the solar light.

To achieve an object of the present invention, the present invention provides a concentration photovoltaic solar tracking device, includes: a solar panel for concentrating solar light; a solar tracking sensor, which is formed of 4 division photodiode for concentrating the solar light irradiated to the solar panel by using a Fresnel lens, and detecting a focus when the focus of the Fresnel lens is irradiated; at least two solar light detectors, which are included on different sides of the solar panel and detect the solar light; and a control means, including: a first control unit for controlling the orbit and the altitude of the solar panel based on a degree of brightness in the solar light detected in the solar light detector, and a second control unit for controlling the orbit and the altitude of the solar panel based on focus information of the Fresnel lens, which is formed on the 4 detected division photodiode.

The solar tracking sensor includes: a Fresnel lens for concentrating solar light; a first print circuit substrate having the 4 division photodiode for detecting the focus when the concentrated solar light is irradiated and the focus of the Fresnel lens is formed; and a solar light loss preventing means for supporting an interval between the Fresnel lens and the first print circuit substrate and preventing loss of the concentrated solar light.

The device further includes: a second print circuit substrate, which is connected to a lower part of the first print circuit substrate and has the second control unit receiving focus information of the Fresnel lens formed on the 4 division photodiode.

The outside of the solar tracking sensor may be formed of heat insulating boards.

The 4 division photodiode may be divided into 2 2 array.

The device of claim 2, wherein the solar light loss preventing means may be formed of lenses.

To achieve another object of the present invention, the present invention provides a concentration photovoltaic solar tracking method, includes: tracking solar light through at least two solar light detectors for detecting solar light by being formed on different axes of a solar panel for concentrating solar light; controlling orbit and altitude of the solar panel based on a degree of brightness in the detected solar light; tracking solar light through a solar tracking sensor for concentrating the solar light irradiated to the solar panel by using a Fresnel lens and including a 4 division photodiode for detecting a focus of the Fresnel lens when the focus is irradiated; and controlling the orbit and the altitude of the solar panel based on focus information of the Fresnel lens formed on the detected 4 division photodiode.

The said secondarily tracking solar light through a solar tracking sensor includes: concentrating the solar light through the Fresnel lens; forming a focus of the Fresnel lens on the 4 division photodiode by irradiating the concentrated solar light; and detecting the focus of the Fresnel lens through the 4 division photodiode.

BRIEF DESCRIPTION OF THE DRAWINGS

FIG. 1 is a perspective view showing a schematic appearance of a concentration photovoltaic solar tracking device in accordance with an embodiment of the present invention.

FIG. 2A is a cross-sectional view showing a solar tracking sensor in accordance with an embodiment of the present invention.

FIG. 2B is a front view showing the solar tracking sensor in accordance with the embodiment of the present invention.

FIG. 3A is a front view showing a solar light detector, which is applied to present invention.

FIG. 3B is a cross-sectional view taken along the AA direction in FIG. 3A.

FIG. 4 is a side view of FIG. 1.

FIG. 5 is an electric block diagram showing the concentration photovoltaic solar tracking device in accordance with an embodiment of the present invention.

FIG. 6 is a flowchart describing a tracking method of the concentration photovoltaic solar tracking device in accordance with an embodiment of the present invention.

FIG. 7 is a flowchart describing a solar tracking step using the solar tracking sensor in accordance with an embodiment of the present invention.

| | [Detailed Description of Main Elements] |
|---|---|
| 100: | concentration photovoltaic solar tracking device |
| 110: | solar panel |
| 120: | solar panel support |
| 130: | rotation axis |
| 140: | rotation axis driving device |
| 141: | orbit tracking motor |
| 150: | angle control stick |
| 160: | angle control stick driving device |
| 161: | altitude tracking motor |
| 170: | support case |
| 180: | coupling stick |
| 200: | solar tracking sensor |
| 210: | Fresnel lens |
| 220: | 4 division photodiode |
| 230: | first print circuit substrate |
| 240: | solar light loss preventing means |
| 250: | second print circuit substrate |
| 260: | heat insulating board |
| 300: | solar light detector |
| 310: | case |
| 320: | sensor module |
| 330: | cable |
| 400: | solar light detecting block |
| 410: | first detecting unit |
| 420: | second detecting unit |
| 421: | primary tracking sensor |
| 425: | secondary tracking sensor |
| 430: | data communication block |
| 440: | data storage |
| 450: | motor driving block |
| 460: | control means |
| 470: | solar light generating block |
| 480: | central control unit |

DESCRIPTION OF SPECIFIC EMBODIMENTS

A concentration photovoltaic solar tracking device and method of the present invention will be described in detail with reference to the accompanying drawings, which is set forth hereinafter. The drawings introduced below are provided as examples for sufficiently transferring the concept of the present invention to those skilled in the art. Accordingly, the present invention is not limited to the drawings introduced below and may be specified into other formats. Also, the same reference numbers over the entire specification represent the same constituent elements.

Unless defined otherwise, all terms (including technical and scientific terms) used herein have the same meaning as commonly understood by one of ordinary skill in the art. A detailed description on the known function and configuration that may blur the point of the present invention is omitted in the following description and accompanying drawings.

FIG. 1 is a perspective view showing a schematic appearance of a concentration photovoltaic solar tracking device in accordance with an embodiment of the present invention. FIG. 2A is a cross-sectional view showing a solar tracking sensor in accordance with an embodiment of the present invention. FIG. 2B is a front view showing the solar tracking sensor in accordance with the embodiment of the present invention. FIG. 3A is a front view showing a solar light detector, which is applied to present invention. FIG. 3B is a cross-sectional view taken along the AA direction in FIG. 3A. FIG. 4 is a side view of FIG. 1. FIG. 5 is an electric block diagram showing the concentration photovoltaic solar tracking device in accordance with an embodiment of the present invention. FIG. 6 is a flowchart describing a tracking method of the concentration photovoltaic solar tracking device in accordance with an embodiment of the present invention.

FIG. 7 is a flowchart describing a solar tracking step using the solar tracking sensor in accordance with an embodiment of the present invention.

First of all, the concentration photovoltaic solar tracking device of the present invention will be described hereinafter with reference to FIG. 1.

As shown in FIG. 1, the concentration photovoltaic solar tracking device of the present invention includes: a solar panel 110 for concentrating solar light; a solar tracking sensor 200, which is formed of a 4 division photodiode 220 for concentrating the solar light irradiated to the solar panel 110 by using a Fresnel lens 210, and detecting a focus when the focus of the Fresnel lens 210 is irradiated; at least two solar light detectors 300, which are included on different sides of the solar panel 110 and detect the solar light; and a control means 460, including: a first control unit 461 for controlling the orbit and the altitude of the solar panel 110 based on a degree of brightness in the solar light detected in the solar light detector 300, and a second control unit 462 for controlling the orbit and the altitude of the solar panel 110 based on focus information of the Fresnel lens 210, which is formed on the 4 detected division photodiode 220.

The solar tracking sensor 200 according to the present invention will be described with reference to FIG. 2. As shown in FIGS. 2A and 2B, the solar tracking sensor 200, includes: a Fresnel lens 210 for concentrating solar light; a first print circuit substrate 230 having the 4 division photodiode 220 for detecting the focus when the concentrated solar light is irradiated and the focus of the Fresnel lens 210 is formed; and a solar light loss preventing means 240 for supporting an interval between the Fresnel lens 210 and the first print circuit substrate 230 and preventing loss of the concentrated solar light.

The solar tracking sensor 200 may further include a second print circuit substrate 250, which is connected to a lower part of the first print circuit substrate 230 and has the second control unit 462 receiving focus information of the Fresnel lens 210 formed on the 4 division photodiode 220.

An outside of the solar tracking sensor 200, which further includes the second print circuit substrate 250, is formed of heat insulating boards 260 in order to minimize damage due to heat generated when the solar light is concentrated. Meanwhile, the 4 division photodiode 220 is divided into a 2 2 array and the solar light loss preventing block 240 is formed of lenses.

The solar light detector 300, which is applied to the present invention, will be described with reference to FIG. 3. The solar light detector 300 is disclosed in KR Patent No. 10-0727283, which is registered on Jun. 5, 2007 and has a title of a sunlight sensor, an apparatus and method for condensing sunlight using the sunlight sensor. It will be described in detail for easy understanding.

As shown in FIGS. 3A and 3B, the solar light detector 300 according to the present invention includes a sensor module 320 for detecting solar light; a case 310 having the built-in sensor module 320; and a cable 330 for supplying power to the sensor module 320 or outputting a detection signal corresponding to a degree of brightness, which is detected in the sensor module 320.

A light sensor 321 of the sensor module includes a halo sensor 321a, a right light sensor 321c and a left light sensor 321b. That is, when each of the light sensors 321a 321b and 321c is attached to each side of a sensor attachment pad 323 such that the light sensors 321a 321b and 321c have different directions, different degrees of brightness are detected according to the locations of the sun. For example, when the sun is in a direction opposed to the right light sensor 321c, other two light sensors 321*a* and 321*b* have the sun at their back. Accordingly, the right light sensor 321*c* detects the largest degree of brightness.

A detailed configuration of the concentration photovoltaic solar tracking device according to the present invention will be described hereinafter with reference to FIG. 4.

As shown in FIG. 4, the concentration photovoltaic solar tracking device 100 of the present invention includes a solar panel 110 for concentrating solar light and a solar panel support 120; a rotation axis 130 for controlling a direction of the solar panel support 120, i.e., for rotating the solar panel support 120, and a rotation axis driving device 140; an angle control stick 150 for controlling an angle between the solar panel support 120 and a ground, and an angle control stick driving device 160; a solar light detector 300, which supports the rotation axis 130 and the rotation axis driving device 140 and is attached to an appropriate place on a top surface of the solar panel support 120; and a support case 170, which includes a built-in electronic device for controlling driving of the angle control stick driving device 160 and the rotation axis driving device 140 according to a detection signal inputted by the solar tracking sensor 200, and which includes a built-in electronic device for supplying driving power of the solar tracking sensor, the solar light detector 300, the solar tracking sensor 200, the angle control stick driving device 160 and the rotation axis driving device 140.

Although not shown, it is obvious that a cable connects between the solar tracking sensor 200, the solar light detector 300, the angle control stick driving device 160 and the rotation axis driving device 140, and the electronic devices and power supplies embedded in the support case 170.

In the above configuration, the solar panel support 120 forms a connection board 121 on its back and is coupled with the rotation axis 130 by a coupling stick 180.

The rotation axis driving device 140 includes a rotation axis gear 143 for rotating the rotation axis 130 and an orbit tracking motor 141 for driving the rotation axis gear 143. A gear 131 formed around the lower end of the rotation axis 130 engages with the rotation axis gear 142. A support 120 for supporting the angle control stick driving device 160 and the angle control stick 150 is formed on one side of the rotation axis 130.

The angle control stick 150 includes a angle control stick gear 162 for driving the angle control stick 150 up and down and an altitude tracking motor 161 for driving the angle control stick gear 162. In particular, the angle control stick 150 may be formed of a screw jack. The orbit tracking motor 141 and the altitude tracking motor 161 may be realized as a common direct current (DC) motor or hydraulic motor.

As shown in FIG. 1, two of the solar light detector 300 used in the present invention described with reference to FIG. 3 are installed on the top surface of the solar panel support 120 according to their usage. The solar light detector 300 installed on the end of the top surface is a solar orbit detector 300*a* for detecting a solar orbit. The solar light detector 300 installed on the middle of the top surface is a sun altitude detector 300*b* for detecting a solar altitude. In particular, the solar orbit detector 300*a* and the sun altitude detector 300*b* are fixed to the solar panel support 120 such that the halo sensor 321*a* can have the solar panel 110 at its back.

A configuration of the electronic block diagram showing the concentration photovoltaic solar tracking device described above will be described with reference to FIG. 5.

As shown in FIG. 5, the electric configuration of the concentration photovoltaic solar tracking device 100 according to the present invention includes: a solar light detecting block 400 for detecting a degree of solar brightness and outputting detection signals including corresponding orbit and altitude signals; a motor driving block 450 for driving the orbit tracking motor 141 and the altitude tracking motor 161; a data communication block 430 for transmitting the detection signals including data on a direction and a degree of rotation in the orbit tracking motor 141 and the altitude tracking motor 161 based on the degree of brightness detected in the solar light detecting block 400; a data storage 440 for storing data transmitted by the data communication block 430; a control block 460 for controlling the motor driving block 450 according to the detection signal inputted from the solar light detecting block 400; and a solar light generating block 470 for supplying power to the control block 460, the solar light detecting block 400, the motor driving block 450, the data communication block 430, and the data storage 440.

The solar light detecting block 400 includes a first detecting unit 410, a second detecting unit 420, a wind velocity sensor 427, a temperature sensor 428 and an automatic power cutting device 429. The first detecting unit 410 includes an orbit detector 411 for detecting a solar orbit and generating an orbit signal including orbit information, and an altitude detector 412 for detecting a solar altitude and generating an altitude signal including altitude information.

The second detecting unit 420 includes a primary tracking sensor 421 for primarily tracking solar light and a secondary tracking sensor 425 for secondarily tracking solar light. The primary tracking sensor 421 includes an orbit angular detector 422 for detecting a solar orbit angular through the solar light detector 300 and generating an orbit angular signal including orbit angular information, and an altitude angular detector 423 for detecting a solar altitude angular and generating an altitude angular signal including altitude angular information. The secondary tracking sensor 425 includes a solar light focus detector 426 for generating a focus signal including solar light focus information through the solar tracking sensor 200.

The primary tracking sensor 421 of the first detecting unit 410 and the second detecting unit 420 designates each of the solar orbit detector 300*a* and the sun altitude detector 300*b* included in the solar panel support 120 of a plurality of concentration photovoltaic solar tracking devices 100. The secondary tracking sensor 425 of the second detecting unit 420 designates each of the solar tracking sensors 200 included in the solar panel support 120 of a plurality of concentration photovoltaic solar tracking devices 100.

Meanwhile, the primary tracking sensor 421 induces Direct Normal Insolation (DNI) of the solar light to the Fresnel lens 210 by control of the first control unit 461. The secondary tracking sensor 425 moves DNI of the solar light induced by the primary tracking sensor 421 by control of the second control unit 462 to a central point of the 4 division photo diode 220.

Meanwhile, the wind velocity sensor 427 and the temperature sensor 428 measure wind velocity and temperature as factors of the environment where the concentration photovoltaic solar tracking device 100 is equipped. When a wind velocity measurement value and a temperature measurement value measured by the wind velocity sensor 427 and the temperature sensor 428 reach a setup value that may greatly affect the concentration photovoltaic solar tracking device 100, the automatic power cutting device 429 automatically intercepts the power of the concentration photovoltaic solar tracking device 100.

The control block 460 is connected to a central control unit 480 through the data communication block 430. The central control unit monitors and controls each of the solar light detectors 300*a* and 300*b* for controlling a plurality of solar light concentrate devices 100. The control block 460 includes the first control unit 461 for controlling the orbit and the altitude of the solar panel 110 according to the degree of brightness of the solar light detected by the solar light detector 300, and the second control unit 462 for controlling the orbit and the altitude of the solar panel 110 based on focus information of the Fresnel lens 210 formed on the 4 division photodiode 220 detected by the solar tracking sensor 200.

The central control unit 480 includes a central computer 485 for storing a solar trace and a solar altitude value according to seasons, comparing each detection signal, tracking the solar light detector 300 or the solar tracking sensor 200 where errors occur, and outputting a compensation signal. The motor driving block 450 includes an orbit tracking motor driving unit 451 for driving the orbit tracking motor 141 and an altitude tracking motor driving unit 452 for driving the altitude tracking motor 161.

The data communication block 430 transmits the detection signal to the orbit tracking motor 141, the altitude tracking motor 161, and the central control unit 480. The solar light generating block 470 includes a concentrating unit 471 for concentrating solar light, a storage 472 for converting light energy concentrated in the concentrating unit 471 into electric energy, and a power converting unit 473 for converting electric power of the electric energy of the storage 472.

The detection signal may include data on the rotation direction and the rotation degree of the orbit tracking motor 141 and the altitude tracking motor 161 according to the degree of solar brightness. Also, the compensation signal includes data on the rotation direction and the rotation degree of the orbit tracking motor 141 and the altitude tracking motor 161 having an average value of each detection signal.

A concentration photovoltaic solar tracking method of the present invention according to the above-mentioned configuration will be described with reference to FIG. 6.

As shown in FIG. 6, the concentration photovoltaic solar tracking method, tracking solar light through at least two solar light detectors 300 for detecting solar light by being formed on different axes of a solar panel 110 for concentrating solar light; controlling orbit and altitude of the solar panel 110 based on a degree of brightness in the detected solar light; tracking solar light through a solar tracking sensor 200 for concentrating the solar light irradiated to the solar panel 110 by using a Fresnel lens 210 and including a 4 division photodiode 220 for detecting a focus of the Fresnel lens 210 when the focus is irradiated; and controlling the orbit and the altitude of the solar panel 110 based on focus information of the Fresnel lens 210 formed on the detected 4 division photodiode 220.

Before describing the concentration photovoltaic solar tracking method of the above-mentioned configuration, a principle for tracking solar light by using the solar light detector 300 will be described as follows.

When a degree of brightness detected in the halo sensor 321*a* of the solar orbit detector 300*a* is larger than a degree of brightness detected in two other light sensors 321*b* and 321*c*, i.e., when the sun is in the back of the solar panel 110, the rotation axis 130 rotates at a predetermined angle, e.g., 180°. On the other hand, when a degree of brightness detected in the left light sensor 321*b* of the solar orbit detector 300*a* is smaller than a degree of brightness detected in the right light sensor 321*c*, the rotation axis 130 rotates at a predetermined angle, i.e., at an angle that the sun is opposed to a corner of both side surfaces, to which the right light sensor 321*c* and the left light sensor 321*b* are attached, in the sensor attachment pad 323. A rotation direction is a counter-clockwise direction.

It is a known fact that when an incidence angle is 90°, the detected degree of brightness has the largest value. When differences between the detected degrees of brightness in each of the light sensors 321*a*, 321*b* and 321*c* of the sun altitude detector 300*b* is out of the predetermined range, the height of the angle control stick 150 is controlled such that the differences between the detected degrees of brightness in each of the light sensors 321*a*, 321*b* and 321*c* can be within the predetermined range. For example, when the degree of brightness detected in the halo sensor 321*a* is smaller than that detected in other two light sensors 321*b* and 321*c*, the angle control stick 150 goes down by the angle control stick driving device 160.

The above-mentioned sun altitude detector 300*b* may be used to maintain the incidence angle at 90°, but is not limited thereto. For example, according to the sun altitude detector 300*b* described above, the light sensors installed on each side of the sensor attachment pad 323 detect the solar altitude but it is also possible to detect the solar altitude by installing one light sensor on the top surface of the sensor attachment pad 323 by modifying the structure. Also, the solar orbit detector 300*a* may be used without the sun altitude detector 300*b*. After controlling the rotation axis 130 such that the degree of brightness detected in the right light sensor 321*c* coincides with that detected in the left light sensor 321*b*, the height of the angle control stick 150 may be controlled such that the degrees of brightness detected in each of the light sensors 321*a*, 321*b* and 321*c* coincide with each other.

Based on the above-mentioned principle, a primarily step S100 of tracking solar light through at least two solar light detectors 300 for detecting the solar light by being installed on different sides of the solar panel 110 for concentrating solar light, and a primarily step S200 for controlling an orbit and an altitude of the solar panel 110 according to the degree of brightness of the solar light detected in the solar light detector 300 will be described hereinafter.

Each detection signal generated in the solar light detector 300 is transmitted to the data storage 440 through the data communication block 430 and stored.

The first control unit 461 of the control block 460 receives the detection signal from the first detecting unit 410 and the primary tracking sensor 421 and simultaneously monitors the first detecting unit 410 and the primary tracking sensor.

In addition, the first control unit 461 analyzes the detection signal stored in the data storage 430 and controls the orbit tracking motor driving unit 451 for driving the orbit tracking motor 141 and the altitude tracking motor driving unit 452 for driving the altitude tracking motor 161. The first control unit 461 may lead DNI of the solar light through the Fresnel lens 210 by controlling the primary tracking sensor 421.

The central control unit 480 receives the detection signal generated in the solar orbit detector 300*a* and the sun altitude detector 300*b* of the concentration photovoltaic solar tracking device 100 transmitted through the data communication block 430 and analyzes the detection signal. The central control unit 480 stores solar trace information in the central computer 485. An average value of the solar orbit and altitude is calculated by comparing the solar trace information and the detection signal. After calculating the average value of the solar orbit and altitude, a compensation signal including information on the rotation direction and degree of the orbit tracking motor 141 and the altitude tracking motor 161 is outputted correspondingly to the average value and transmitted to the first control unit 461.

The first control unit 461 receiving the compensation signal controls the orbit tracking motor 141 and the altitude tracking motor 161 correspondingly to the compensation signal by controlling the orbit tracking motor driving unit 451 and the altitude tracking motor driving unit 452. The control block 460, the solar light detecting block 400, the data communication block 430, the data storage 440, and the motor driving block 450 may receive electric power from the solar light generating block 470.

A principle of tracking solar light by the solar tracking sensor 200 will be described as follows.

Solar light irradiated to the solar panel 110 through the Fresnel lens 210 is concentrated. The Fresnel lens 210 forms a focus on the 4 division photodiode 220 by the concentrated solar light. The focus of the Fresnel lens 210 is figured in an opposite side of the location of the sun irradiating the solar light. The focus information including location information of the focus figured on the 4 division photodiode 220, which is divided into 4 parts of a 2 2 array, is transmitted to the second control unit 462 of the control unit.

The second control unit 462 analyzes the focus information and grasps a point where the focus of the Fresnel lens 210 is formed among points '☐' to '☐' on the 4 division photodiode 220. The second control unit 462 controls the motor driving block 450 according to the point where the focus is formed, drives the orbit tracking motor 141 and the altitude tracking motor 161 and moves the solar panel 110 correspondingly to the solar location.

00 irradiated to the solar panel 110 by using the Fresnel lens 210 based on the operation principle of the solar tracking sensor 110 described above and tracking the solar light through the solar tracking sensor 200 including the 4 division photodiode 220 for detecting the focus when the focus of the Fresnel lens 210 is irradiated, and a secondarily step S400 of controlling the orbit and the altitude of the solar panel 110 based on the focus information of the Fresnel lens 210 formed in the 4 division photodiode 220 detected by the solar tracking sensor 200 will be described as follows.

The secondary tracking sensor 425 moves DNI of the solar light induced by the primary tracking sensor 421 by control of the second control unit 462 to a central point of the 4 division photo diode 220. The solar light whose DNI is performed through the Fresnel lens 210 is irradiated to the 4 division photodiode 220 such that the focus of the Fresnel lens 210 is formed on the 4 division photodiode 220. The solar light focus detector 426 of the secondary tracking sensor 425 detects the focus of the Fresnel lens 210 through the 4 division photodiode 220 and transmits focus information including the focus location of the Fresnel lens 210 formed on the 4 division photodiode 220 to the second control unit 462 of the control block 460. The second control unit 462 analyzes the focus information, decodes the focus location of the Fresnel lens 210, and moves the solar panel 110 in an opposite direction of the focus location.

8 points are settled on the 4 division photodiode 220 with reference to FIG. 2B and movement of the solar panel 110 according to the 8 points will be described.

When the focus of the Fresnel lens 210 is formed on the point "③" in the west of the 4 division photodiode 220, the second control unit 462 operates the orbit tracking motor 141 or the altitude tracking motor 161 and moves the solar panel 110 to the east. When the focus of the Fresnel lens 210 is formed on the point "☐" in the northwest of the 4 division photodiode 220, the second control unit 462 operates the orbit tracking motor 141 or the altitude tracking motor 161 and moves the solar panel 110 to the south and then to the east.

When the focus of the Fresnel lens 210 is formed on the point "☐" in the north of the 4 division photodiode 220, the second control unit 462 operates the orbit tracking motor 141 or the altitude tracking motor 161 and moves the solar panel 110 to the south. When the focus of the Fresnel lens 210 is formed on the point "☐" in the northeast of the 4 division photodiode 220, the second control unit 462 operates the orbit tracking motor 141 or the altitude tracking motor 161 and moves the solar panel 110 to the south.

When the focus of the Fresnel lens 210 is formed on the point "☐" in the east of the 4 division photodiode 220, the second control unit 462 operates the orbit tracking motor 141 or the altitude tracking motor 161 and moves the solar panel 110 to the west. When the focus of the Fresnel lens 210 is formed on the point "☐" in the southeast of the 4 division photodiode 220, the second control unit 462 operates the orbit tracking motor 141 or the altitude tracking motor 161 and moves the solar panel 110 to the north.

When the focus of the Fresnel lens 210 is formed on the point "☐" in the south of the 4 division photodiode 220, the second control unit 462 operates the orbit tracking motor 141 or the altitude tracking motor 161 and moves the solar panel 110 to the north. When the focus of the Fresnel lens 210 is formed on the point "☐" in the southwest of the 4 division photodiode 220, the second control unit 462 operates the orbit tracking motor 141 or the altitude tracking motor 161 and moves the solar panel 110 to the east.

While a focus is formed on the 4 division photodiode 220 by the solar light through the Fresnel lens 210, the solar light is efficiently concentrated by the common lens, which is the solar light loss preventing block 240. In the solar tracking sensor 200, it is preferred to minimize damage due to heat generated while concentrating the solar light by using the heat insulating board 260 covering the outside of the solar tracking sensor 200.

The concentration photovoltaic solar tracking device according to the present invention grasps a solar location by tracking a solar fine orbit and altitude in a state that an exact location of the sun is grasped over the entire azimuth angles through the solar light detector for detecting the solar orbit and altitude.

Also, a maximum efficiency in solar light generation is provided by controlling a solar tracking sensor such that the location of the solar cell can be properly changed correspondingly to the variation of the solar orbit or altitude.

While the present invention has been described with respect to the specific embodiments, it will be apparent to those skilled in the art that various changes and modifications may be made without departing from the spirit and scope of the invention as defined in the following claims.

What is claimed is:

1. A concentration photovoltaic solar tracking device, comprising:
    a solar panel for concentrating solar light;
    a solar tracking sensor, which is formed of a 4 division photodiode for concentrating the solar light irradiated to the solar panel by using a Fresnel lens, and detecting a focus when the focus of the Fresnel lens is irradiated;
    at least two solar light detectors, which are included on different sides of the solar panel and detect the solar light; and
    a control means, including:
    a first control unit for controlling the orbit and the altitude of the solar panel based on a degree of brightness in the solar light detected in the solar light detector, and
    a second control unit for controlling the orbit and the altitude of the solar panel based on focus information of the Fresnel lens, which is formed on the 4 division photodiode, wherein the solar tracking sensor includes:
    the Fresnel lens for concentrating solar light;

a first print circuit substrate having the 4 division photodiode for detecting the focus when the concentrated solar light is irradiated and the focus of the Fresnel lens is formed;

a solar light loss preventing means for supporting an interval between the Fresnel lens and the first print circuit substrate and preventing loss of the concentrated solar light; and a second print circuit substrate, which is connected to a lower part of the first print circuit substrate and has the second control unit receiving focus information of the Fresnel lens formed on the 4 division photodiode.

2. The device of claim 1, wherein the outside of the solar tracking sensor is formed of heat insulating boards.

3. The device of claim 1, wherein the 4 division photodiode is divided into a 2 by 2 array.

4. The device of claim 1, wherein the solar light loss preventing means is formed of lenses.

5. A concentration photovoltaic solar tracking method, comprising:

primarily tracking solar light through at least two solar light detectors for detecting solar light by being formed on different axes of a solar panel for concentrating solar light;

primarily controlling orbit and altitude of the solar panel based on a degree of brightness in the detected solar light;

secondarily tracking solar light through a solar tracking sensor for concentrating the solar light irradiated to the solar panel by using a Fresnel lens and including a 4 division photodiode for detecting a focus of the Fresnel lens when the focus is irradiated; and secondarily controlling the orbit and the altitude of the solar panel based on focus information of the Fresnel lens formed on the detected 4 division photodiode, wherein the solar tracking sensor includes:

the Fresnel lens for concentrating solar light;

a first print circuit substrate having the 4 division photodiode for detecting the focus when the concentrated solar light is irradiated and the focus of the Fresnel lens is formed;

a solar light loss preventing means for supporting an interval between the Fresnel lens and the first print circuit substrate and preventing loss of the concentrated solar light; and a second print circuit substrate, which is connected to a lower part of the first print circuit substrate and has the second control unit receiving focus information of the Fresnel lens formed on the 4 division photodiode.

6. The method of claim 5, wherein said secondarily tracking solar light through a solar tracking sensor includes:

concentrating the solar light through the Fresnel lens;

forming a focus of the Fresnel lens on the 4 division photodiode by irradiating the concentrated solar light; and detecting the focus of the Fresnel lens through the 4 division photodiode.

7. The method of claim 5, wherein the outside of the solar tracking sensor is formed of heat insulating boards.

8. The method of claim 5, wherein the 4 division photodiode is divided into a 2 by 2 array.

9. The method of claim 5, wherein the solar light loss preventing means is formed of lenses.

* * * * *